(12) United States Patent
Chou

(10) Patent No.: US 9,863,802 B2
(45) Date of Patent: Jan. 9, 2018

(54) PHOTOELECTRIC SWITCH HAVING A FIRST SHELL HALF AND A SECOND SHELL HALF COOPERATING WITH A ROLLING CHAMBER TO DEFINE A LIGHT PASSAGE

(71) Applicant: Tien-Ming Chou, Taichung (TW)

(72) Inventor: Tien-Ming Chou, Taichung (TW)

( * ) Notice: Subject to any disclaimer, the term of this patent is extended or adjusted under 35 U.S.C. 154(b) by 77 days.

(21) Appl. No.: 15/195,549

(22) Filed: Jun. 28, 2016

(65) Prior Publication Data

US 2017/0284861 A1   Oct. 5, 2017

(30) Foreign Application Priority Data

Apr. 1, 2016   (TW) .............................. 105110488 A

(51) Int. Cl.
*H01H 35/02* (2006.01)
*G01J 1/02* (2006.01)
*G01J 1/44* (2006.01)

(52) U.S. Cl.
CPC ............... *G01J 1/0271* (2013.01); *G01J 1/44* (2013.01)

(58) Field of Classification Search
CPC ....... G01J 1/0271; G01C 9/10; G02B 6/3582; H01H 35/02

USPC .................................................. 250/221, 239
See application file for complete search history.

(56) References Cited

U.S. PATENT DOCUMENTS

| 5,202,559 | A | * | 4/1993 | Durst | ....................... G01C 9/06 200/61.45 R |
| 6,800,841 | B1 | | 10/2004 | Chou | |
| 7,402,791 | B2 | | 7/2008 | Chou | |

* cited by examiner

*Primary Examiner* — Que T Le
(74) *Attorney, Agent, or Firm* — Hamre, Schumann, Mueller & Larson, P.C.

(57) ABSTRACT

A photoelectric switch includes first and second shell halves respectively having first and second coupled surfaces which confront each other along an axis in either a horizontal direction or an upright direction. The coupled surfaces respectively have first and second recessed regions aligned with each other to confine a rolling chamber for a roller to be rollable therein, and define left and right holes at two opposite ends of the rolling chamber, and emitter and receiver accommodating chambers outwardly of the left and right holes for accommodating a light emitter and a light receiver such that a light passage is defined by the left and right holes and the rolling chamber.

13 Claims, 8 Drawing Sheets

PHOTOELECTRIC SWITCH HAVING A FIRST SHELL HALF AND A SECOND SHELL HALF COOPERATING WITH A ROLLING CHAMBER TO DEFINE A LIGHT PASSAGE

CROSS-REFERENCE TO RELATED APPLICATION

This application claims priority of Taiwanese Patent Application No. 105110488, filed on April 1, 2016.

FIELD

The disclosure relates to a photoelectric switch, and more particularly to a photoelectric switch with two shell halves coupled with each other to confine a rolling chamber, and two light holes cooperatively defining a light passage.

BACKGROUND

Referring to FIG. 1, a conventional photoelectric tilt switch disclosed in U.S. Pat. No. 6,800,841 B1 includes a housing 11, a cover 12, a modular insert body 13, a light emitter 14, a light receiver 15 and a roller 16. By virtue of the modular insert body 13 which is inserted into the housing 11 to define a closed light passage between the light emitter 14 and the light receiver 15, the tilt switch is able to have various degrees of sensitivity by replacement of the modular insert body 13 so as to be used for different kinds of electric apparatuses. However, the modular insert body is relatively inconvenient to assemble and results in a higher cost.

SUMMARY

Therefore, an object of the disclosure is to provide a photoelectric switch that can be easy to assemble at a relatively low cost.

According to the disclosure, the photoelectric switch includes a light emitter, a light receiver, a roller, a first shell half and a second shell half. The light emitter has an emitting portion disposed at an end of a light passage that, when in a non-tilted position, extends in a horizontal direction. The light receiver has a receiving portion disposed at an opposite end of the light passage. The roller is disposed between the emitting and receiving portions and is movable between a blocking position to block the light passage and a non-blocking position to unblock the light passage.

The first shell half has a first coupled surface which is disposed in a plane normal to an upright direction, and which includes a first recessed region extending in the horizontal direction to terminate at first left and right hole wall halves, and first left and right recessed regions extending outwardly and respectively from the first left and right hole wall halves. The second shell half has a second coupled surface which is disposed in a plane normal to the upright direction, and which includes a second recessed region extending in the horizontal direction to terminate at second left and right hole wall halves, and second left and right recessed regions extending outwardly and respectively from the second left and right hole wall halves. The first and second coupled surfaces confront each other in the upright direction and are configured such that the first recessed region is aligned with the second recessed region in the upright direction to confine a rolling chamber therebetween, that the first left and right hole wall halves are aligned respectively with the second left and right hole wall halves in the upright direction to respectively confine left and right holes, wherein the left and right holes cooperate with the rolling chamber to define the light passage, and that the first left and right recessed regions are aligned respectively with the second left and right recessed regions in the upright direction to respectively confine emitter and receiver accommodating chambers that are respectively in spatial communication with the left and right holes for accommodating the light emitter and receiver, respectively.

Alternatively, the first shell half has a first coupled surface which is disposed in a plane normal to the horizontal direction, and which includes a first surrounding region surrounding an axis in the horizontal direction, and a first recessed region extending from the first surrounding region toward the axis and converged in the horizontal direction to terminate at a left hole. The second shell half has a second coupled surface which is disposed in a plane normal to the horizontal direction, and which includes a second surrounding region surrounding the axis, and a second recessed region extending from the second surrounding region toward the axis to terminate at a right hole. The first and second coupled surfaces confront each other in the horizontal direction and are configured such that the first surrounding region is complementarily engaged with the second surrounding region, that the first recessed region is aligned with the second recessed region in the horizontal direction to confine a rolling chamber therebetween, and that the left and right holes are aligned with each other along the axis to cooperate with the rolling chamber to define the light passage.

Alternatively, the first shell half has a first coupled surface which is disposed in a plane normal to an axis, and which includes a first surrounding region surrounding the axis, and a first recessed region disposed inwardly of the first surrounding region. The second shell half has a second coupled surface which is disposed in a plane normal to the axis, and which includes a second surrounding region surrounding the axis, and a second recessed region disposed inwardly of the second surrounding region. The first and second coupled surfaces confronting each other along the axis and are configured such that the first surrounding region is complementarily engaged with the second surrounding region, and that the first recessed region is aligned with the second recessed region along the axis to confine a rolling chamber therebetween. The first and second recessed regions are configured to have a flat area and a tapered area opposite to each other in the horizontal direction. The flat area extends in the upright direction and has a right hole. The tapered area is converged leftwardly and has a left hole.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
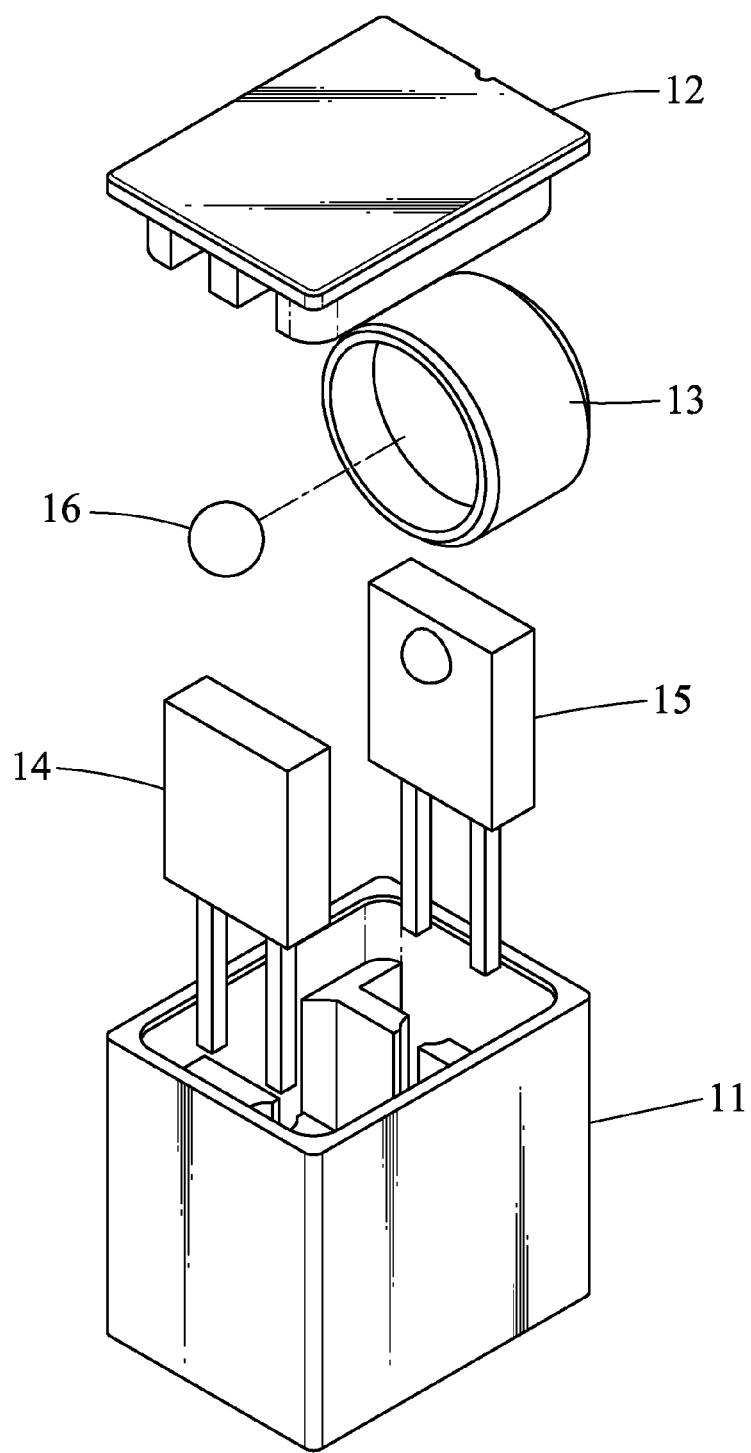
FIG. 1 is an explodedperspective view of a conventional photoelectric switch.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
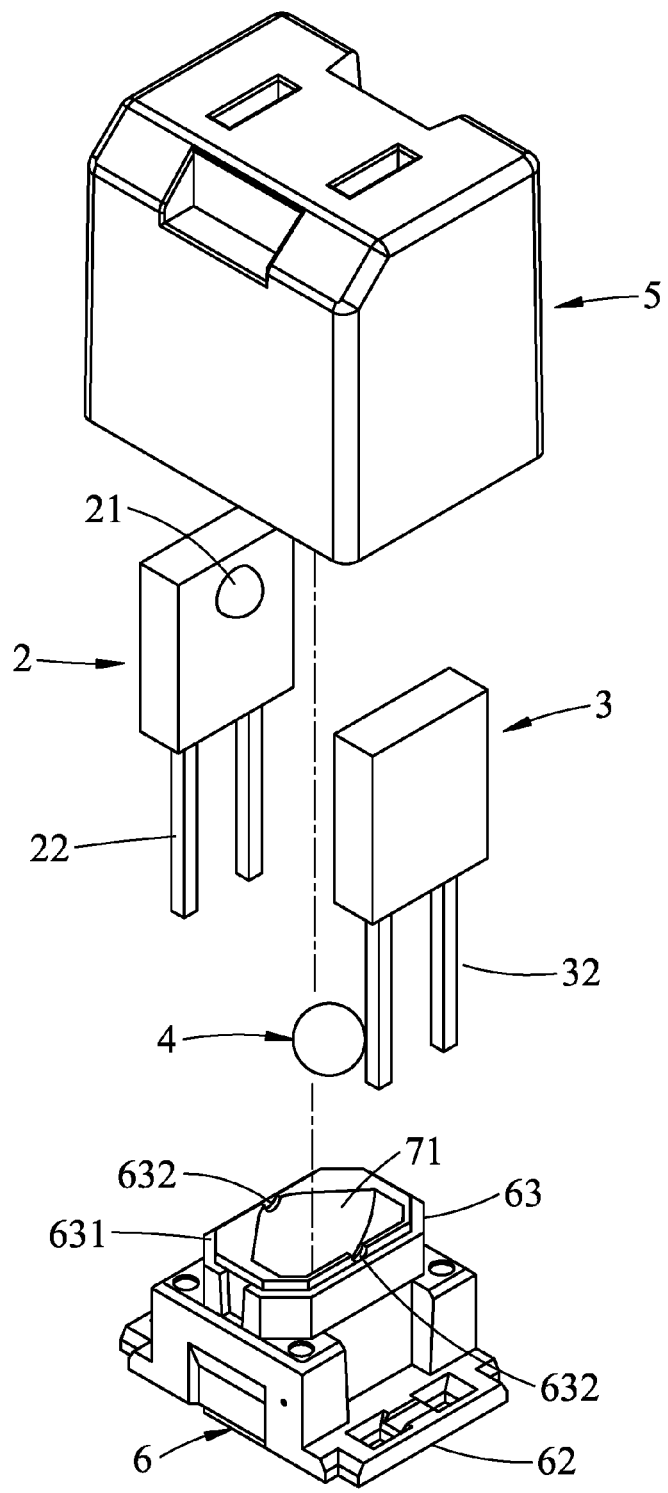
FIG. 2 is an exploded perspective view of a first embodiment of a photoelectric switch according to the disclosure.
Figure 3:
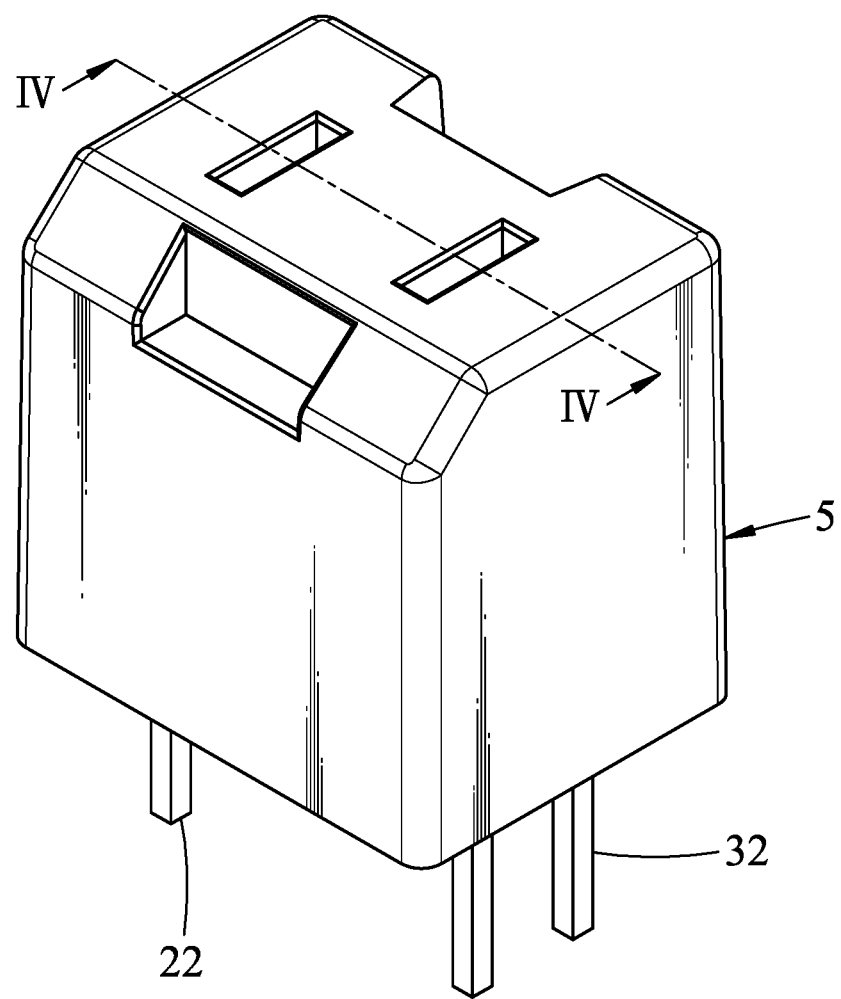
FIG. 3 is a perspective view of the first embodiment.
Figure 4:
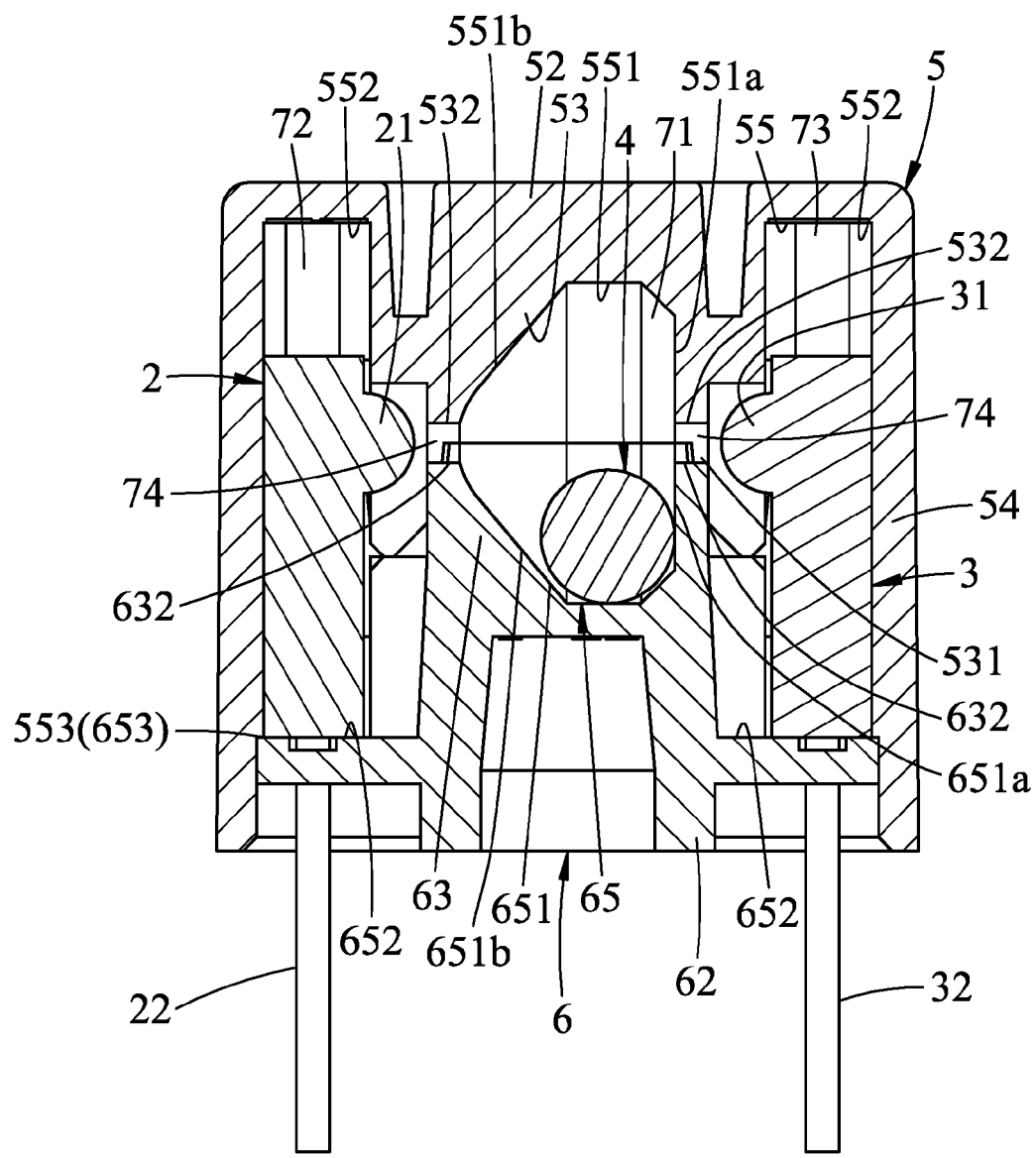
FIG. 4 is a sectional view taken along IV-IV of FIG. 3.

Referring to FIGS. 2 to 4, the first embodiment of the photoelectric switch according to this invention is shown to include a light emitter 2, a light receiver 3, a roller 4, a first shell half 5 and a second shell half The light emitter 2 has an emitting portion 21 and a terminal portion 22. The light receiver 3 has a receiving portion 31 which is disposed opposite to the emitting portion 21 along a light passage that, when in a non-tilted position, extends in a horizontal direction, and a terminal portion 32. The roller 4 is disposed between the emitting and receiving portions 21, 31 and is movable between a blocking position to block the light passage and a non-blocking position to unblock the light passage.

The first shell half 5 has a base wall 52 and inner and outer surrounding walls 53, 54 extending from the base wall 52 in an upright direction. The outer surrounding wall 54 surrounds the inner surrounding wall 53. The inner and outer surrounding walls 53, 54 have a first coupled surface 55 which is disposed in a plane normal to an axis in the upright direction. The first coupled surface 55 includes a first recessed region 551 which is disposed at the inner surrounding wall 53 and which extends in the horizontal direction to terminate at first left and right hole wall halves 532, a first surrounding engaging region 531 (see FIG. 4) which is disposed at a lower periphery of the inner surrounding wall 53, first left and right recessed regions 552 which extend outwardly and respectively from the first left and right hole wall halves 532, and a first surrounding region 553 which is disposed at the outer surrounding wall 54 and which surrounds the axis.

The second shell half 6 has a base wall 62 and a surrounding wall 63 extending from the base wall 62 in the upright direction. The base wall 62 and the surrounding wall 63 have a second coupled surface 65 which is disposed in a plane normal to the axis. The second coupled surface 65 includes a second recessed region 651 which is disposed at the surrounding wall 63 and which extends in the horizontal direction to terminate at second left and right hole wall halves 632, a second surrounding engaging region 631 (see FIG. 2) which is disposed at an upper periphery of the surrounding wall 63, second left and right recessed regions 652 which extend outwardly and respectively from the second left and right hole wall halves 632, and a second surrounding region 653 which is disposed at the base wall 62 and which surrounds the axis.

The first and second coupled surfaces 55, 65 confront each other along the axis (in the upright direction) to permit the first surrounding engaging region 531 and the first surrounding region 553 to be complementarily engaged with the second surrounding engaging region 631 and the second surrounding region 653, respectively, and are configured such that the first recessed region 551 is aligned with the second recessed region 651 in the upright direction to confine a rolling chamber 71 therebetween, that the first left and right hole wall halves 532 are aligned respectively with the second left and right hole wall halves 632 in the upright direction to respectively confine left and right holes 74, wherein the left and right holes 74 cooperate with the rolling chamber 71 to define the light passage, and that the first left and right recessed regions 552 are aligned respectively with the second left and right recessed regions 652 in the upright direction to respectively confine emitter and receiver accommodating chambers 72, 73 that are respectively in spatial communication with the left and right holes 74 for accommodating the light emitter 2 and the light receiver 3, respectively, to have the terminal portions 22, 32 extending outwardly from the second shell half 6.

The first and second recessed regions 551, 651 are symmetrical to each other with respect to the upright direction. Each of the first and second recessed regions 551, 651 has a deep area defining a largest depth thereof. Each of the first left and right recessed regions 552 has a depth larger than the largest depth of the first recessed region 551. Each of the second left and right recessed regions 652 has a depth larger than the largest depth of the second recessed region 651. The first and second recessed regions 551, 651 respectively have flat areas (551*a*, 651*a*) which extend in the upright direction from the deep area and which meet with each other at the right hole 74, and tapered areas (551*b*, 651*b*) which extend from the deep area to converge toward each other to meet at the left hole 74. The first and second recessed regions 551, 651 are treated by destaticization.

By the engagement of the first and second shell halves 5, 6 along the axis to confine the rolling chamber 71 and the left and right holes 74 so as to cooperatively define the light passage, the assembly process is easy and convenient with a relatively low cost, and light leakage therefrom can be avoided. With such a structure, the destaticization of the first and second recessed regions 551, 651 can be readily performed for minimizing static electricity generated in the rolling chamber 71 that interferes with the movement of the roller 4.

Figure 5:
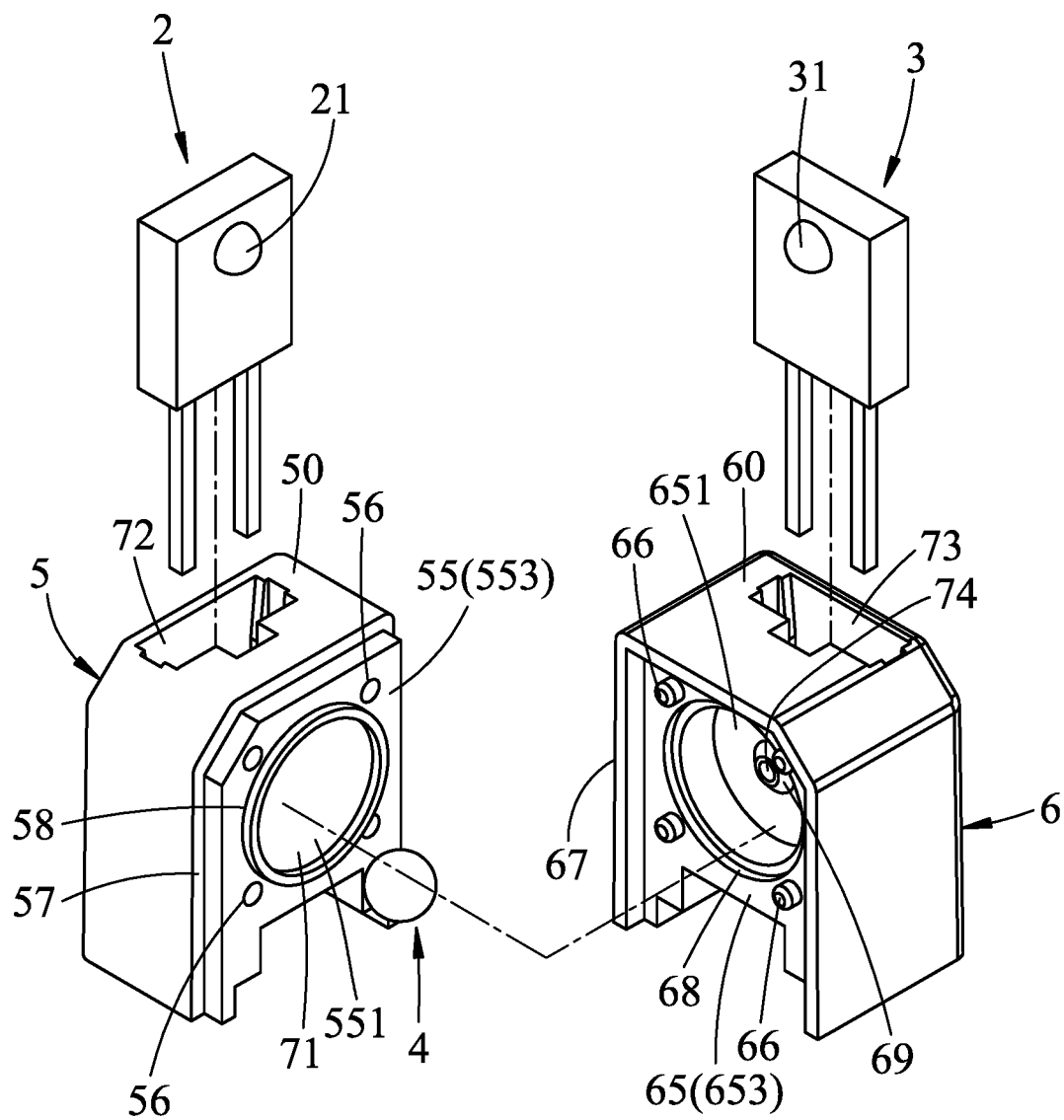
FIG. 5 is an exploded perspective view of a second embodiment of a photoelectric switch according to the disclosure.
Figure 6:
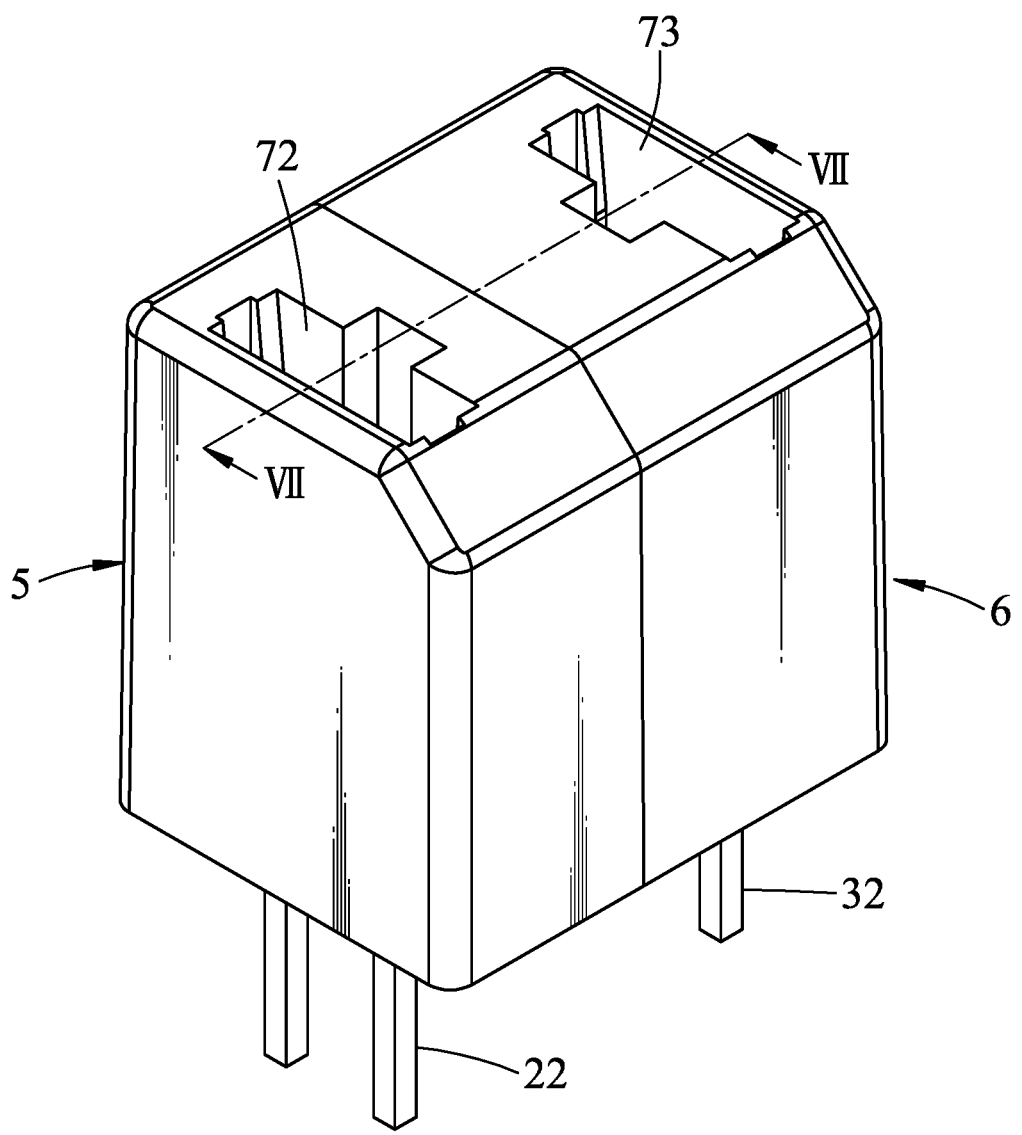
FIG. 6 is a perspective view of the second embodiment.
Figure 7:
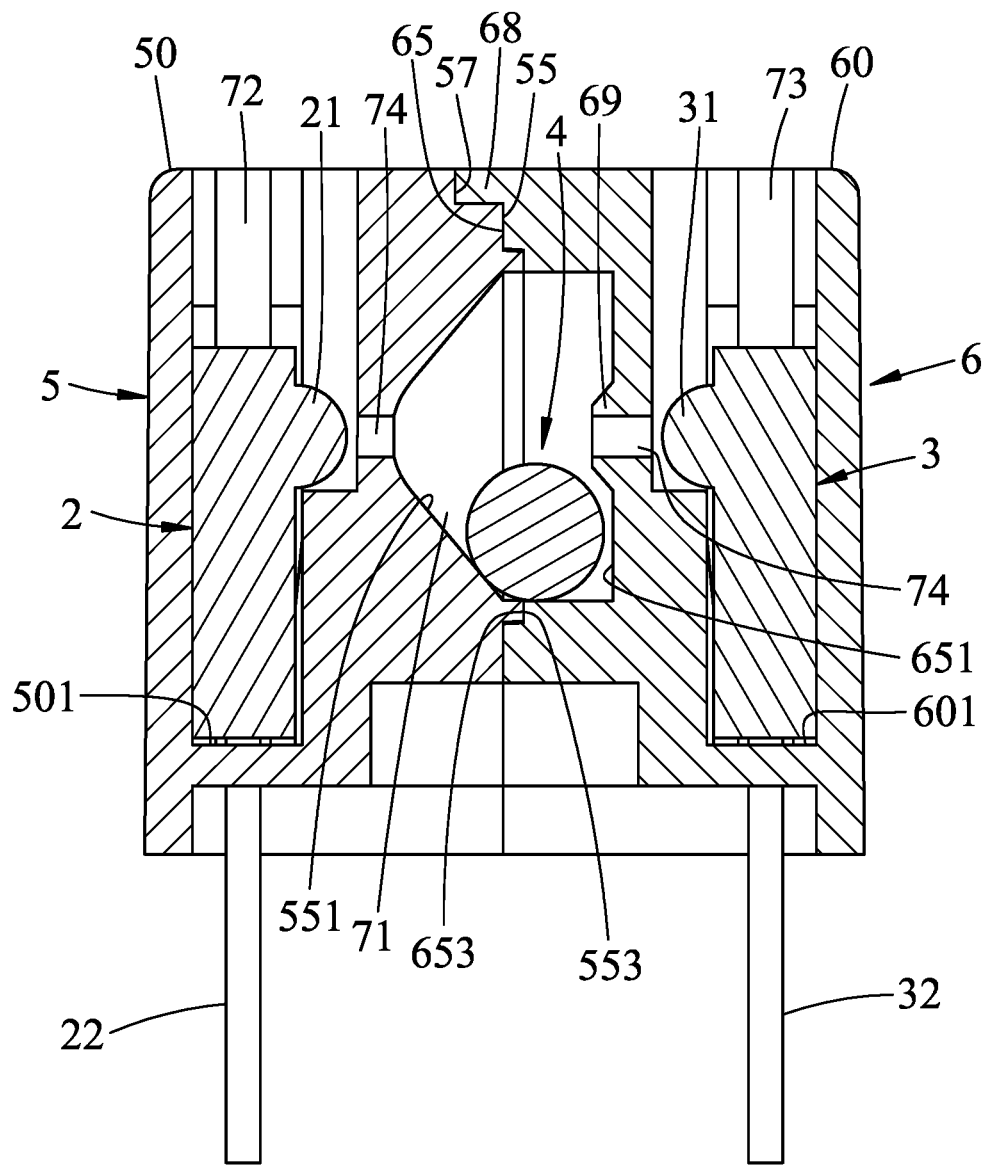
FIG. 7 is a sectional view taken along VII-VII of FIG. 6.

Referring to FIGS. 5 to 7, a second embodiment of the photoelectric switch includes a first shell half 5 and a second shell half 6 which are coupled to each other along an axis in a horizontal direction. The first shell half 5 has a first coupled surface 55 which is disposed in a plane normal to the axis and which includes a first surrounding region 553 surrounding the axis, and a first recessed region 551 which extends from the first surrounding region 553 toward the axis and which is converged in the horizontal direction to terminate at a left hole 74. That is, the first recessed region 551 is formed as a tapered area which is converged leftwardly and which has the left hole 74 extending therethrough. The second shell half 6 has a second coupled surface 65 which is disposed in a plane normal to the axis, and which includes a second surrounding region 653 surrounding the axis, and a second recessed region 651 extending from the second surrounding region 653 toward the axis to terminate at a right hole 74. That is, the second recessed region 651 is formed as a flat area which is disposed opposite to the tapered area in the horizontal direction and which has the right hole 74 extending therethrough.

The first surrounding region 553 may include a surrounding protrusion 58, four engaging sockets 56 and a U-shaped concaved portion 57. The second surrounding region 653 may include a surrounding concaved area 68, four engaging plugs 66 and a U-shaped projecting portion 67 fittingly engaged with the surrounding protrusion 58, the engaging sockets 56 and the concaved portion 57, respectively. Each of the first and second surrounding regions 553, 653 has an inner periphery of a circular shape to surround the axis so as to define a circular cross-section of the rolling chamber 71. The second recessed region 651 has a bump 69 surrounding the right hole 74.

The first shell half 5 has an first upper surface 50 and a left recessed region 501 which is recessed from the first upper surface 50 in the upright direction to confine an emitter accommodating chamber 72 therein and which is in spatial communication with the left hole 74 for accommodating the light emitter 2. The second shell half 6 has a second upper surface 60 and a right recessed region 601 which is recessed from the second upper surface in the upright direction to confine a receiver accommodating chamber 73 therein and which is in spatial communication with the right hole 74 for accommodating the light receiver 3. The terminal portions 22, 32 of the light emitter 2 and the light receiver 3 extend outwardly from the first shell half 5 and the second shell half 6, respectively. Alternatively, the first shell half 5 has a left recessed region which is recessed upwardly from a lower surface thereof, and the second shell half 6 has a right recessed region which is recessed upwardly from a lower surface thereof, thereby concealing the openings of the left and right recessed regions. Moreover, during fabrication of a plurality of photoelectric switches, a plurality of light emitters 2 and light receivers 3 can be simultaneously inserted into the corresponding shell halves 5, 6 for resulting in convenient and rapid assembly.

Figure 8:
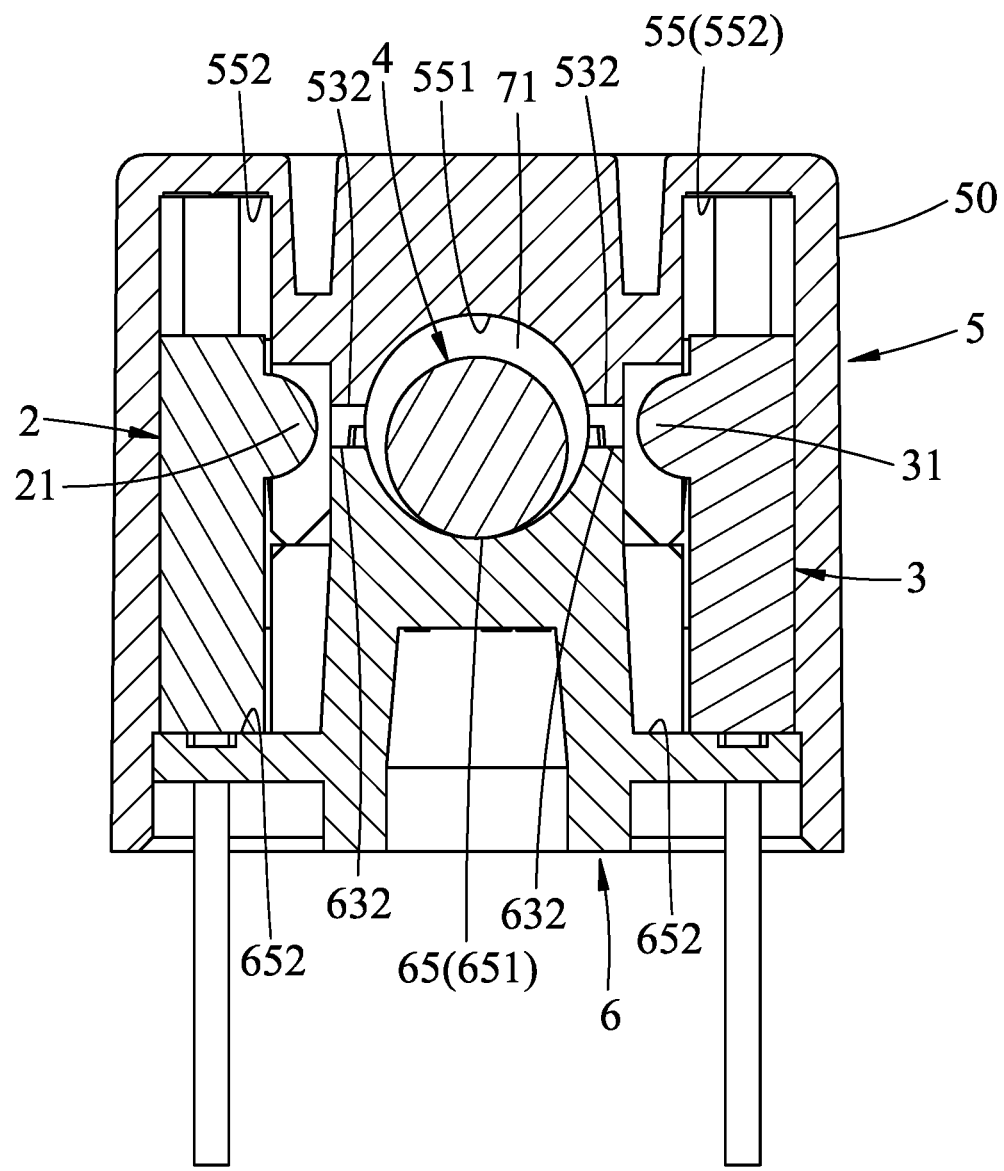
FIG. 8 is a sectional view of a third embodiment of a photoelectric switch according to the disclosure.

Referring to FIG. 8, a third embodiment of the photoelectric switch is substantially similar to the first embodiment in structure. The photoelectric switch of this embodiment is a photoelectric vibration switch. The roller 4 is spherical in shape and is made from a light-transmissive material. Each of the first and second recessed regions 551, 651 is semi-spherical so as to confine the rolling chamber 71 of a spherical shape to prompt the rolling movement of the roller 4 to thereby enhance the sensitivity of the photoelectric switch A light signal emitted from the emitting portion 21 of the light emitter 2 is reflected by the roller 4 which is spherical in shape and made from a light-transmissive material. A portion of light beams of the reflected light is received by the receiving portion 31 of the light receiver 3. Once vibration occurs, the amount of the light beams received by the receiving portion 31 is changed for further processing.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A photoelectric switch comprising:
   a light emitter having an emitting portion disposed at an end of a light passage that, when in a non-tilted position, extends in a horizontal direction;
   a light receiver having a receiving portion disposed at an opposite end of said light passage;
   a roller disposed between said emitting and receiving portions and movable between a blocking position to block said light passage and a non-blocking position to unblock said light passage;
   a first shell half having a first coupled surface which is disposed in a plane normal to an upright direction, and which includes a first recessed region extending in the horizontal direction to terminate at first left and right hole wall halves, and first left and right recessed regions extending outwardly and respectively from said first left and right hole wall halves; and
   a second shell half having a second coupled surface which is disposed in a plane normal to the upright direction, and which includes a second recessed region extending in the horizontal direction to terminate at second left and right hole wall halves, and second left and right recessed regions extending outwardly and respectively from said second left and right hole wall halves;
   said first and second coupled surfaces confronting each other in the upright direction and being configured such that
      said first recessed region is aligned with said second recessed region in the upright direction to confine a rolling chamber therebetween,
      said first left and right hole wall halves are aligned respectively with said second left and right hole wall halves in the upright direction to respectively confine left and right holes, said left and right holes cooperating with said roiling chamber to define said light passage, and
      said first left and right recessed regions are aligned respectively with said second left and right recessed regions in the upright direction to respectively confine emitter and receiver accommodating chambers that are respectively in spatial communication with said left and right holes for accommodating said light emitter and receiver, respectively.

2. The photoelectric switch of claim 1, wherein said first and second recessed regions are symmetrical to each other with respect to the upright direction.

3. The photoelectric switch of claim 2, wherein each of said first and second recessed regions has a deep area defining a largest depth thereof, each of said first left and right recessed regions having a depth larger than the largest depth of said first recessed region, each of said second left and right recessed regions having a depth larger than the largest depth of said second recessed region.

4. The photoelectric switch of claim 3, wherein said first and second recessed regions respectively have flat areas which extend in the upright direction from said deep area and which meet with each other at said right hole, and tapered areas which extend from said deep area to converge toward each other to meet at said left hole.

5. The photoelectric switch of claim 3, wherein each of said first and second recessed regions is semi-spherical so as to confine said rolling chamber of a spherical shape.

6. The photoelectric switch of claim 5, wherein said roller is spherical in shape and made from a light-transmissive material.

7. The photoelectric switch of claim 1, wherein said first and second recessed regions are treated by destaticization.

8. A photoelectric switch comprising:
a light emitter having an emitting portion disposed at an end of a light passage that, when in a non-tilted position, extends in a horizontal direction;
a light receiver having a receiving portion disposed at an opposite end of said light passage;
a roller disposed between said emitting and receiving portions and movable between a blocking position to block said light passage and a non-blocking position to unblock said light passage;
a first shell half having a first coupled surface which is disposed in a plane normal to the horizontal direction, and which includes a first surrounding region surrounding an axis in the horizontal direction, and a first recessed region extending from said first surrounding region toward the axis and converged in the horizontal direction to terminate at a left hole; and
a second shell half having a second coupled surface which is disposed in a plane normal to the horizontal direction, and which includes a second surrounding region surrounding the axis, and a second recessed region extending from said second surrounding region toward the axis to terminate at a right hole;
said first and second coupled surfaces confronting each other in the horizontal direction and being configured such that
said first surrounding region is complementarily engaged with said second surrounding region,
said first recessed region is aligned with said second recessed region in the horizontal direction to confine a rolling chamber therebetween, and
said left and right holes are aligned with each other along the axis to cooperate with said rolling chamber to define said light passage.

9. The photoelectric switch of claim 8, wherein each of said first and second surrounding regions has an inner periphery of a circular shape to surround the axis so as to define a circular cross-section of said rolling chamber.

10. The photoelectric switch of claim 9, wherein said second recessed region has a bump surrounding said right hole.

11. The photoelectric switch of claim 8, wherein said first shell half has an first upper surface and a left recessed region which is recessed from said first upper surface in the upright direction and which is in spatial communication with said left hole for accommodating said light emitter, said second shell half having a second upper surface and a right recessed region which is recessed from said second upper surface in the upright direction and which is in spatial communication with said right hole for accommodating said light receiver.

12. The photoelectric switch of claim 8, wherein said first and second recessed regions are treated by destaticization.

13. A photoelectric switch comprising:
a light emitter having an emitting portion disposed at an end of a light passage that, when in a non-tilted position, extends in a horizontal direction;
a light receiver having a receiving portion disposed at an opposite end of said light passage;
a roller disposed between said emitting and receiving portions and movable between a blocking position to block said light passage and a non-blocking position to unblock said light passage;
a first shell half having a first coupled surface which is disposed in a plane normal to an axis, and which includes a first surrounding region surrounding the axis, and a first recessed region disposed inwardly of said first surrounding region; and
a second shell half having a second coupled surface which is disposed in a plane normal to the axis, and which includes a second surrounding region surrounding the axis, and a second recessed region disposed inwardly of said second surrounding region;
said first and second coupled surfaces confronting each other along the axis and being configured such that
said first surrounding region is complementarily engaged with said second surrounding region, and
said first recessed region is aligned with said second recessed region along the axis to confine a rolling chamber therebetween;
said first and second recessed regions are configured to have a flat area and a tapered area opposite to each other in the horizontal direction, said flat area extending in an upright direction and having a right hole, said tapered area being converged leftwardly and having a left hole.

* * * * *